United States Patent
Bertram et al.

(10) Patent No.: US 11,616,175 B2
(45) Date of Patent: Mar. 28, 2023

(54) LUMINOPHORE MIXTURE, CONVERSION ELEMENT AND OPTOELECTRONIC COMPONENT

(71) Applicant: Osram OLED GmbH, Regensburg (DE)

(72) Inventors: Ralph Bertram, Herzogenrath (DE); Ivar Tangring, Regensburg (DE); Philipp Pust, Langquaid (DE)

(73) Assignee: Osram OLED GmbH, Regensburg (DE)

( * ) Notice: Subject to any disclaimer, the term of this patent is extended or adjusted under 35 U.S.C. 154(b) by 184 days.

(21) Appl. No.: 16/769,531

(22) PCT Filed: Dec. 10, 2018

(86) PCT No.: PCT/EP2018/084202
§ 371 (c)(1),
(2) Date: Jun. 3, 2020

(87) PCT Pub. No.: WO2019/115462
PCT Pub. Date: Jun. 20, 2019

(65) Prior Publication Data
US 2020/0388732 A1  Dec. 10, 2020

(30) Foreign Application Priority Data
Dec. 14, 2017  (DE) .......................... 102017129917.3

(51) Int. Cl.
*H01L 33/56* (2010.01)
*H01L 33/50* (2010.01)
*C09K 11/02* (2006.01)

(52) U.S. Cl.
CPC ............. *H01L 33/56* (2013.01); *C09K 11/02* (2013.01); *H01L 33/502* (2013.01);
(Continued)

(58) Field of Classification Search
CPC ..... H01L 33/56; H01L 33/502; H01L 33/507; H01L 33/508; H01L 33/504
See application file for complete search history.

(56) References Cited

U.S. PATENT DOCUMENTS

2010/0193806 A1  9/2010  Byun
2012/0195340 A1  8/2012  Cheon et al.
(Continued)

FOREIGN PATENT DOCUMENTS

DE  112012001482 T5   2/2014
EP       3243887 A1  11/2017
(Continued)

OTHER PUBLICATIONS

Ga Pb et al; "Density of minerals III: Oxides and stoichiometry Ratio of 0 atoms to cation atoms Density (gm/cm 3 see above Lime Ca0 Periclase Mg0 Quartz Si02", Jun. 10, 2010.
(Continued)

*Primary Examiner* — Mark W Tornow
(74) *Attorney, Agent, or Firm* — ArentFox Schiff LLP

(57) ABSTRACT

The invention relates to a luminophore mixture which comprises at least one quantum dot luminophore and at least one functional material, the functional material is formed such that it scatters electromagnetic radiation and/or has a high density.

15 Claims, 2 Drawing Sheets

(52) U.S. Cl.
CPC .......... *H01L 33/507* (2013.01); *H01L 33/508* (2013.01); *H01L 33/504* (2013.01); *H01L 2933/0091* (2013.01)

(56) References Cited

U.S. PATENT DOCUMENTS

| | | |
|---|---|---|
| 2014/0246689 A1 | 9/2014 | Luo et al. |
| 2016/0254417 A1* | 9/2016 | Morimura ............ H01L 33/508 257/98 |
| 2016/0260873 A1* | 9/2016 | Yamada ................ H01L 33/50 |
| 2018/0122993 A1* | 5/2018 | Camras ................ H01L 33/505 |

FOREIGN PATENT DOCUMENTS

| | | |
|---|---|---|
| WO | 03093393 A1 | 11/2003 |
| WO | 2016/111483 A1 | 7/2016 |
| WO | 2016111483 A1 | 7/2016 |

OTHER PUBLICATIONS

International Search Report and Written Opinion issued in International Patent Application No. PCT/EP2018/084202 dated Mar. 6, 2019.
Directive 2011/65/EU of the European Parliament and of the Council on the restriction of the use of certain hazardous substances in electrical and electronic equipment, Office Journal of the European Union of Jun. 8, 2011, L 174/88-L174/110.

\* cited by examiner

LUMINOPHORE MIXTURE, CONVERSION ELEMENT AND OPTOELECTRONIC COMPONENT

This application is a 35 U.S.C. § 371 National Phase of PCT Application No. PCT/EP2018/084202, filed Dec. 10, 2018, which claims priority to German Application No. 10 2017 129 917.3, filed Dec. 14, 2017, the disclosures of each of which are hereby incorporated by reference herein.

A phosphor mixture, a conversion element and an optoelectronic component are specified.

A phosphor mixture having improved efficiency when used in an optoelectronic component is to be specified. In addition, a conversion element that likewise has improved efficiency when used in an optoelectronic component is to be specified. Moreover, an optoelectronic component having elevated efficiency is to be specified.

These objects are achieved by a phosphor mixture, a conversion element and an optoelectronic component according to the independent claims. Advantageous embodiments and developments of the phosphor mixture, of the conversion element and of the optoelectronic component are the subject matter of the respective dependent claims.

A phosphor mixture comprising at least one quantum dot phosphor and at least one functional material is specified. Said functional material is designed to scatter electromagnetic radiation and/or has a high density.

The quantum dot phosphor and the functional material are in particulate form in the phosphor mixture, unless explicitly stated otherwise.

Quantum dot phosphors shall be understood here and hereinafter to mean semiconductor particles having a size in the nanometer range, the converting properties of which arise from their limited dimensions. Typically, quantum dot phosphors comprise a core and a shell. The bandgap of the shell is adjusted via the material and size such that it absorbs the electromagnetic radiation of an excitation spectrum. The composition and dimensions of the core are in turn such that it emits a portion of the energy absorbed again as electromagnetic radiation in the emission spectrum. Quantum dot phosphors have, for example, a diameter between 2 nm and 20 nm inclusive. As well as the core and shell, one or more envelopes including or consisting of resins or glasses may be present. A quantum dot phosphor with an envelope may have a total size of between 50 nm and up to 20 µm. Particularly grains having sizes of more than 100 nm may contain multiple quantum dot phosphors. The envelopes are firstly suitable for preventing or reducing agglomeration of the quantum dot phosphors, and secondly for protecting the generally readily oxidizable materials of the quantum dot phosphors from oxygen or water, for example.

Compared to conventional phosphors, quantum dot phosphors as conversion material in optoelectronic components (for example LEDs), owing to their narrow-band emission spectrum, enable efficiency gains of 20% or more. However, currently available quantum dot phosphors usually contain cadmium compounds, the use of which is limited by an RoHS Directive (RoHS: Restriction of Hazardous Substances). For instance, the proportion of cadmium in the encapsulation material of an LED is limited to 0.01% by weight. With this restriction, it is possible only to achieve efficiency advantages of about 5% compared to conventional phosphors. To get around this problem, LED packages have to date been increased in size, which is unattractive for reasons of cost and lack of compatibility. An alternative to date has been to continue to produce a portion of the light converted with conventional phosphors and to dispense with the gain in efficiency resulting from quantum dot phosphors.

A phosphor mixture of the invention can better exploit the high efficiency of quantum dot phosphors without exceeding the permitted content of cadmium. This is achieved by means of the functional material present in the phosphor mixture.

If the functional material is designed to scatter electromagnetic radiation, more significant scatter in the phosphor mixture reduces the free path length of the light through the material of the phosphor mixture. This means that the quantum dot phosphor present is utilized better or more often for conversion of electromagnetic radiation. With the same amount of quantum dot phosphor in a phosphor mixture, a higher conversion is thus possible, and hence a higher efficiency when the phosphor mixture is being used in an optoelectronic component, for example.

If the functional material additionally or alternatively has a high density, the weight of the phosphor mixture is increased and hence the same proportion by weight of quantum dot phosphors contains a greater number of quantum dot phosphors. Thus, more quantum dot phosphors are available for conversion of electromagnetic radiation and hence lead to an efficiency gain without exceeding the permitted cadmium content.

In one embodiment, the functional material includes a material selected from a group consisting of aluminum oxide, titanium dioxide, oxides of the rare earths, garnets and glasses. These materials may be designed as scattering particles and/or as particles having high density. Aluminum oxide can be used, for example, in the form of α-alumina (sapphire), which has a density of 3.94 g/cm$^3$ and a refractive index of 1.8. Titanium dioxide can be used either in the form of anatase having a density of 3.9 g/m$^3$ and a refractive index of 2.5 or in the form of rutile having a density of 4.23 g/m$^3$ and a refractive index of 2.87. Suitable garnets are, for example, YAG (yttrium aluminum garnet $Y_3Al_5O_{12}$) having a density of 4.6 g/m$^3$ and a refractive index of 1.8 or LuAG (lutetium aluminum garnet $Lu_3Al_5O_{12}$) having a density of more than 6.7 g/cm$^3$ and a refractive index of 1.84. Suitable glasses include specialty glasses having high density and refractive index that can especially be used as scattering materials.

In a further embodiment, the functional material comprises scattering particles having a diameter selected from the range of 0.5 µm to 5 µm. With a diameter selected from this range, the particles can sufficiently increase scatter in the phosphor mixture in order to enhance efficiency.

In a further embodiment, the scattering particles in the phosphor mixture have a proportion selected from the range of 1% to 5% by weight. This sufficiently increases scatter to obtain a gain in efficiency, but not too significantly as to reverse the effect achieved.

In a further embodiment, the functional material comprises particles having high density that have a density of not less than 2 g/cm$^3$. More particularly, the density may be not less than 5 g/cm$^3$. The particles having high density may be designed to scatter or not to scatter. Owing to their high density, the particles act as a heavy filler material that increases the weight of the phosphor mixture and hence enables a higher number of quantum dot phosphors for the same proportion by weight in the phosphor mixture.

In one embodiment, the particles having high density have a diameter of not less than 5 µm. In particular, the particles having high density may have a diameter of not less than 10 µm. A greater diameter of the particles leads to a reduction in scatter. This in turn makes it possible to introduce more high-density particles into the phosphor mixture that increase the weight of the phosphor mixture and hence enable an elevated number of quantum dot phosphors into the phosphor mixture without exceeding the given limits.

In one embodiment, the particles having high density have a proportion in the phosphor mixture of not more than 50% by weight. If the particles having high density are designed to have high scatter, the proportion should not exceed 3% by weight, in order to avoid excessive scatter in the phosphor mixture. If the content of particles having high density that have low or zero scatter is otherwise kept at ≤50% by weight, good processibility of the material of the phosphor mixture is assured.

In a further embodiment, the functional material comprises scattering particles that at least partly convert the electromagnetic radiation of a first wavelength range to electromagnetic radiation of a second wavelength range. Such particles are also referred to hereinafter as scattering phosphor particles or as scattering converting particles. Thus, in the phosphor mixture, at least one quantum dot phosphor is combined with highly scattering phosphor particles. The scattering phosphor particles may have a diameter selected from the range of 0.5 μm to 5 μm.

In this case too, the fact that the more significant scatter reduces the free path length of the light through the phosphor mixture and hence better or more often utilizes the quantum dot phosphors for conversion is exploited. Given the same amount of quantum dot phosphors, a higher conversion is thus enabled and hence a greater efficiency achieved. The electromagnetic radiation of the second wavelength range may be identical to or different than the wavelength range which is emitted by the quantum dot phosphors. It is possible, for example, to combine a scattering green or red phosphor with a red quantum dot phosphor or a green quantum dot phosphor. Scattering phosphor particles may have a proportion in the phosphor mixture of 1% to 30% by weight, especially 20% to 30% by weight.

Scattering phosphor particles that emit red light may be selected, for example, from:
$N(N_aM_{1-a})SX_2AX_2NX_6:D$ where
N is at least one divalent metallic element,
M is a divalent metallic element other than N,
D comprises one, two or more elements from the group of Mn, Ce, Pr, Nd, Sm, Eu, Tb, Dy, Ho, Er, Tm, alkali metals and Yb,
SX comprises at least one tetravalent element,
AX comprises at least one trivalent element,
NX comprises at least one element selected from the group of N, O, F, Cl,
the parameter a is between 0.6 and 1.0 inclusive, preferably between 0.8 and 1.0 inclusive,
$Sr_xCa_{1-x}AlSiN_3:Eu$ where between 0.1% and 5% inclusive of the Sr—Ca lattice sites and/or of the Sr lattice sites and/or of the Ca lattice sites are replaced by Eu, and
$(M)_{2-2x}Eu_{2x}Si_5N_8$ with M=Sr, Ca and/or Ba and $0.001 \leq x \leq 0.2$, preferably $0.01 \leq x \leq 0.1$.

Scattering phosphor particles that emit green light may be selected, for example, from:
beta-SiAlON :RE where 0<x≤4, 0<y≤4, 0<z<1 and RE contains one or more elements selected from rare earth metals, preferably at least Eu and/or Yb,
$Y_3(Al_{1-x}Ga_x)_5O_{12}:Ce$ where the proportion of Ga is $0.2 \leq x \leq 0.6$, preferably $0.3 \leq x \leq 0.5$, further preferably $0.35 \leq x \leq 0.45$, $(Gd,Y)_3(Al_{1-x}Ga_x)_5O_{12}:Ce$, or $(Tb,Y)_3(Al_{1-x}Ga_x)_5O_{12}:Ce$ having a cerium content of 1.5-5 mol %, preferably 2.5-5 mol %, and a gallium content x of 0 to 0.5, preferably x of 0 to 0.1, and
$Lu_3(Al_{1-x}Ga_x)_5O_{12}:Ce$ or $(Lu,Y)_3(Al_{1-x}Ga_x)_5O_{12}:Ce$ having a cerium content of 0.5-5 mol %, preferably 0.5-2 mol %, based in each case on the rare earth metals, and a gallium content x between 0 to 0.5, preferably between 0.15 to 0.3.

Also conceivable are mixtures of the scattering phosphor particles mentioned.

The electromagnetic radiation of the second wavelength range may thus be selected from the red and/or from the green spectral region.

The functional material may also comprise a combination of scattering particles, high-density particles, or scattering particles having converting properties.

In a further embodiment, the at least one quantum dot phosphor may be selected from a group consisting of CdSe, CdS, CdTe, InP, InAs, Cl(Z)S, AlS, $Zn_3N_2$, Si, ZnSe, ZnO and GaN. The proportion of quantum dot phosphor in the phosphor mixture may be about 1% by weight. Owing to the presence of the functional material, it is thus also possible to use Cd-containing quantum dot phosphors in the phosphor mixture, the efficiency of which is well exploited, and, at the same time, the permitted Cd content in the phosphor mixture is not exceeded.

In a further embodiment, the phosphor mixture includes at least one further phosphor. This may comprise, for example, one or more of the materials mentioned above in relation to the scattering phosphor particles. The at least one further phosphor may be present in the phosphor mixture with a proportion of 20% to 30% by weight. The phosphor mixture is thus composed of at least one quantum dot phosphor, the functional material, and at least one further phosphor. The above-described increase in efficiency of the quantum dot phosphor increases the efficiency of the overall phosphor mixture, even in the presence of further phosphors.

The at least one further phosphor may be of the same material as the functional material if it comprises scattering particles designed for wavelength conversion, or different material. The at least one further phosphor may include particles having a diameter greater than 5 μm.

The at least one further phosphor can emit radiation in the red or green wavelength range.

Advantageously, the at least one further phosphor selected may be a phosphor having a high density. This leads to a further increase in the weight of the phosphor mixture and hence enables a higher number of quantum dot phosphors for the same proportion by weight of Cd in the phosphor mixture. One example of such a phosphor is LuAGaG $(Lu_3(Al_{1-x}Ga_x)_5O_{12}:Ce)$ with green emission color ($\lambda_{peak}$ 550-570 nm) and with a specific density of 7 g/cm³, which can be used in place of LuAG with a specific density of 6.7 g/cm³.

In a further embodiment, the at least one quantum dot phosphor and the functional material are in the form of a mixture of particles embedded in a matrix. The matrix here and hereinafter may be a silicone or glass matrix. Silicone has a density of 0.8 to 1 g/cm³ and has a refractive index of 1.4 to 1.55. This makes them particularly suitable as matrix materials. Glasses typically have a density of 2 to 4 g/cm³, specialty glasses even above 5 g/cm³, and refractive indices of 1.4 to more than 2. The latter are therefore especially also suitable as scattering or functional materials.

In a further embodiment, the at least one quantum dot phosphor and the functional material are disposed in two different mutually adjoining regions as particles in a matrix.

In this embodiment, scattering and/or high-density particles are thus in a spatially separate arrangement from the quantum dot phosphor. This arrangement enables a higher concentration of scattering particles or high-density particles in the phosphor mixture on account of the lower solids content in the region in which the functional material is disposed. Thus, casting processes are also enabled at higher concentrations of functional material. Further phosphors may be present in the region in which the quantum dot phosphor is disposed. The further phosphors and the quantum dot phosphors may in turn be arranged separately from one another in different, mutually adjoining regions as particles in a matrix.

In a further embodiment, the region comprising the quantum dot phosphor is free of further phosphors. There is thus a spatial separation here of phosphors and quantum dot phosphors. If, for example, a green phosphor is positioned closer to an electromagnetic radiation-emitting semiconductor chip than the quantum dot phosphor within a phosphor mixture, the flow density of the blue light emitted by the semiconductor chip at the quantum dot phosphor is lowered, which can further increase the efficiency of the quantum dot phosphor.

Additionally specified is a conversion element that includes a phosphor mixture as detailed above. Owing to the composition of the phosphor mixture, such a conversion element has elevated efficiency when it is used in an optoelectronic component. The conversion element may comprise or consist of the phosphor mixture. In addition, the conversion element may take the form of a conversion lamina or of an encapsulation.

All features of the phosphor mixture are thus also applicable to the conversion element and vice versa.

Additionally specified is an optoelectronic component comprising at least one radiation-emitting semiconductor chip that emits electromagnetic radiation of a first wavelength range, and a phosphor mixture as detailed above. The phosphor mixture can particularly efficiently convert the radiation from the semiconductor chip in the optoelectronic component.

All features that are specified in conjunction with the phosphor mixture are thus also applicable to the optoelectronic component, and vice versa.

In one embodiment, the phosphor mixture is present in the optoelectronic component in a conversion element disposed on the semiconductor chip.

In a further embodiment, the phosphor mixture is arranged in the form of an encapsulation on the semiconductor chip.

Further advantageous embodiments and developments of the invention are apparent from the working examples described hereinafter in conjunction with the figures.

Figure 1:
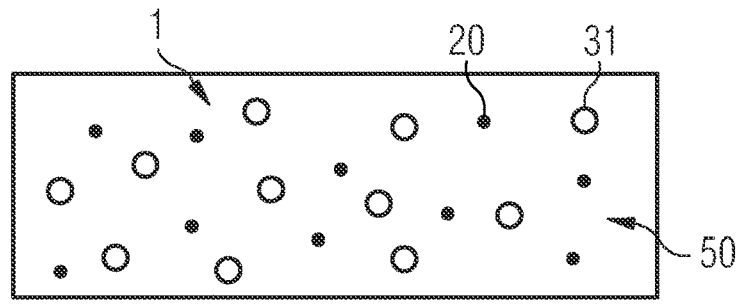
FIGS. 1 to 4 show, in a schematic section view, phosphor mixtures according to working examples.

Elements that are the same, are of the same type or have the same effect are given the same reference numerals in the figures. The figures and the size ratios of the elements shown in the figures relative to one another should not be considered to be to scale. Instead, individual elements, especially layer thicknesses, may be shown in exaggerated size for better representation and/or for better understanding.

FIG. 1 shows the schematic side view of a phosphor mixture 1 in a working example. The phosphor mixture 1 contains a matrix 50 in which particles of quantum dot phosphors 20 and particles of a functional material are disposed. In this working example, the functional material takes the form of scattering particles 31. These increase scatter in the phosphor mixture 1, which reduces the free path length of the light through the phosphor mixture 1 and enables a higher conversion by the quantum dot phosphors 20 present. The proportion of quantum dot phosphors 20 in the phosphor mixture 1 is about 1% by weight, and that of the scattering particles 31 is 1% to 5% by weight. The matrix 50 may, for example, be a silicone matrix. But a matrix of glasses is also conceivable. The quantum dot phosphor 20 may contain or consist of, for example, CdSe, CdS or CdTe. The scattering particles 31 include a material that is, for example, aluminum oxide, titanium dioxide, oxides of the rare earths, garnets or specialty glasses. The diameter of the scattering particles 31 is between 0.5 µm and 5 µm.

In one working example, scattering particles 31 used in the phosphor mixture 1 are 5% by weight of aluminum oxide with a specific density of about 2 $g/cm^3$ and a size of 0.5 to 5 µm. It is thus possible to increase the conversion of electromagnetic radiation of a first wavelength to radiation of a second wavelength by up to 50% by means of the quantum dot phosphors 20. When the phosphor mixture 1 is used in an optoelectronic component, for example a warm white LED, it is thus possible, given the same content of quantum dot phosphors 20 and hence the same content of cadmium, to obtain more converted light from the quantum dot phosphors 20 and hence to increase the efficiency of the white LED by 2% to 5%. The quantum dot phosphor 20 may especially be a red-emitting quantum dot phosphor.

Figure 2:
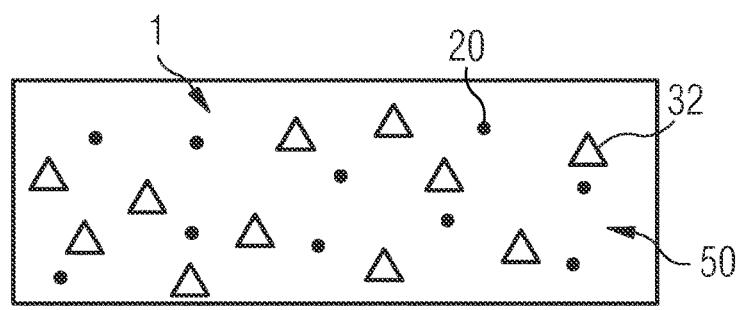

FIG. 2 shows a phosphor mixture 1 in which the scattering particles 31 are replaced by high-density particles 32 that are embedded in the matrix 50 as functional material together with the quantum dot phosphor 20. The high-density particles 32 may likewise contain or consist of, for example, particles of aluminum oxide, titanium dioxide, garnets, oxides of the rare earths or specialty glasses. If the high-density particles 32 are designed to have high scatter, the proportion thereof in the phosphor mixture 1 is 1% to 3% by weight; if they are designed to have zero or low scatter, the proportion thereof is less than 50% by weight. The diameter of the high-density particles 32 is 0.5 to 5 µm when they are designed to have high scatter, otherwise not less than 5 µm. More particularly, the diameter is not less than 10 µm. The density of the high-density particles 32 is not less than 2 $g/cm^3$, preferably not less than 5 $g/cm^3$. The high-density particles 32 increase the weight of the phosphor mixture 1, which means that, given the same proportion by weight, a greater number of quantum dot phosphors 20 may be present in the phosphor mixture 1. Thus, more quantum dot phosphors 20 are available in the phosphor mixture 1 and can lead to an efficiency gain.

Normally, scattering materials in a phosphor mixture are optimized such that a high scattering effect is achieved with little scattering material. If larger particles having a diameter of ≥5 µm, preferably ≥10 µm, are utilized, this enables introduction of distinctly more heavy scattering material owing to their reduced scatter. If the high-density particles 32 introduced into the phosphor mixture 1 are, for example, 10% by weight of aluminum oxide, the density of the phosphor mixture 1 is increased by 4% to 5%. It is thus possible to introduce 4% to 5% more quantum dot phosphors 20 without exceeding the limits for the cadmium content. The amount of high-density particles 32 introduced is limited only for process-related reasons since too high a concentration would make the material too viscous for casting.

If the aluminum oxide in the above example is replaced by a garnet, for example undoped LuAG with a specific density of 6.7 g/cm$^3$, it is possible to introduce 8% to 15% more quantum dot phosphors 20 and hence to correspondingly increase the efficiency.

Figure 3:
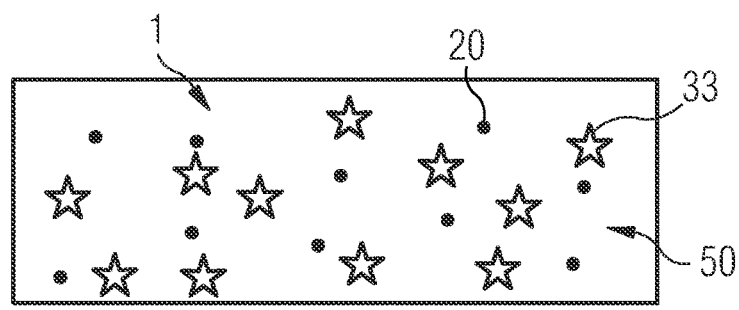

FIG. 3 shows a further working example of a phosphor mixture 1. Compared to the phosphor mixture 1 as shown in FIG. 1, the scattering particles 31 are replaced by scattering converting particles 33 that are present in the matrix 50 as functional material together with the quantum dot phosphor 20. These particles 33 have essentially the same properties with regard to particle diameter and content in the phosphor mixture 1 as the scattering particles 31, except that they additionally have wavelength-converting properties. Examples of such particles 33 are LuAG and LuAGaG. Thus, the scattering converting particles 33 also lead to elevated efficiency, as already elucidated in relation to the scattering particles 31. The scattering converting particles 33 are fine-grain phosphor particles having diameters of 0.5 to 5 µm, which, by contrast with phosphors that are normally used with a grain size of more than 15 µm, are introduced into the phosphor mixture 1.

The examples of FIGS. 1 to 3 may also be present in combination in a phosphor mixture 1 (not shown here). This means that, as well as the quantum dot phosphor 20, functional material may be present in the phosphor mixture 1, comprising scattering particles 31, high-density particles 32 and scattering converting particles 33. Also conceivable as functional material are combinations of scattering particles 31 and high-density particles 32, of scattering particles 31 and scattering converting particles 33, and of high-density particles 32 and scattering converting particles 33.

Figure 4:
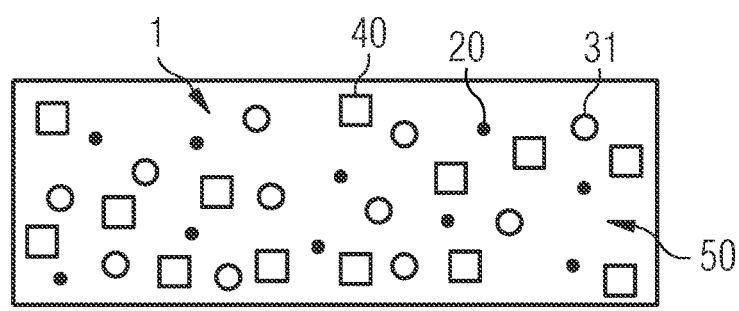

FIG. 4 shows, in a schematic side view, a phosphor mixture 1 which, as well as the quantum dot phosphor 20 and the functional material (scattering particles 31 are shown here by way of example), also contains at least one further phosphor 40. This may be designed, for example, to be red-emitting or green-emitting. In this working example, the quantum dot phosphors 20, the functional material and the further phosphor 40 are mixed in particle form in the matrix 50. In order to further increase the efficiency of the quantum dot phosphor 20, a particularly heavy, i.e. dense, phosphor 40 may be used as further phosphor 40. A suitable example for this purpose is LuAGaG with a specific density of about 7 g/cm$^3$ in place of LuAG with a specific of 6.7 g/cm$^3$. The proportion of the further phosphor 40 in the phosphor mixture 1 is between 20% and 30% by weight.

The phosphor mixture 1 may be used in conversion elements that can be used as conversion laminas or else as encapsulation in optoelectronic components. It is possible in the phosphor mixture 1, for example, for one or more green phosphors to be present together with functional material in a matrix 50 in combination with one or more red phosphors as further phosphors 40, and red quantum dot phosphors 20 or green quantum dot phosphors 20.

Figure 5:
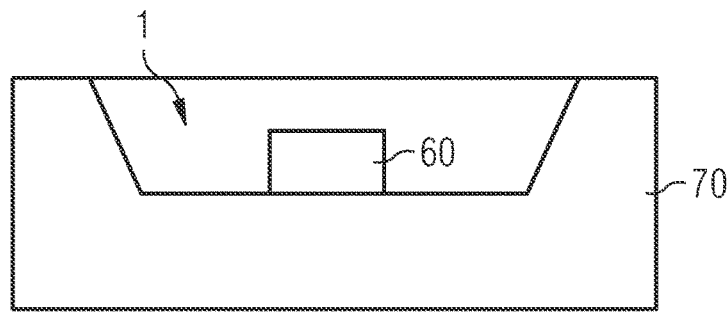
FIGS. 5 to 8 show, in a schematic section view, optoelectronic components according to working examples.

FIG. 5 shows, in a schematic section view, an optoelectronic component with a radiation-emitting semiconductor chip 60 which is preferably a light-emitting diode chip and emits radiation from an excitation spectrum of a first wavelength range. The semiconductor chip 60 is disposed in the recess of a component housing 70. The recess of the housing 70 is also filled with a phosphor mixture 1 in the form of an encapsulation for the semiconductor chip 60. The composition of the phosphor mixture 1 may be as described with regard to FIGS. 1 to 4. The component emits warm white electromagnetic radiation composed of converted radiation from the phosphor mixture 1 and unconverted radiation from the semiconductor chip 60.

Figure 6:
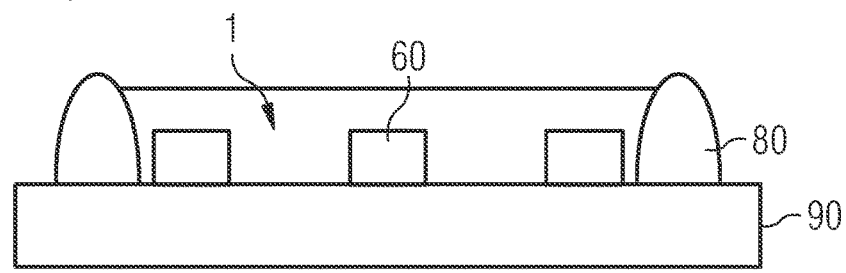

FIG. 6 shows, in a schematic section view, an alternative embodiment of the semiconductor component. Semiconductor chips 60 are disposed here on a substrate 90 that may be a printed circuit board. Semiconductor chips 60 are surrounded by a frame 80. The frame 80 is filled with a phosphor mixture 1, the composition of which may again be as described in one of the examples for FIGS. 1 to 4.

Figure 7:
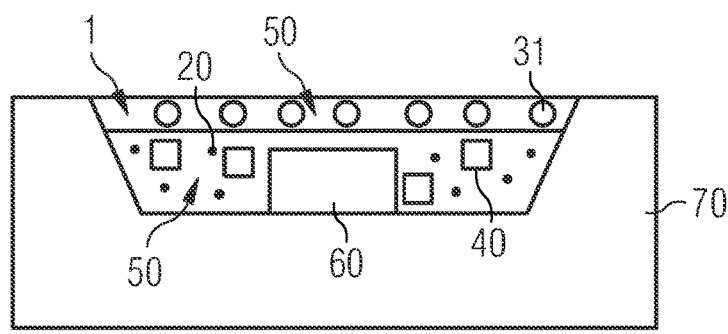

FIG. 7 again shows, in a schematic section view, an optoelectronic component as already described for FIG. 5. The phosphor mixture 1 here has two regions, with the quantum dot phosphors 20 and a further phosphor 40 embedded in a matrix 50 in the lower region in an adjoining arrangement with the semiconductor chip 60. Scattering particles 31 are disposed as functional material in the adjoining region of the phosphor mixture 1 that does not directly adjoin the semiconductor chip 60. In the phosphor mixture 1, there is thus a spatial separation in the phosphor mixture 1 of scattering materials, in this case the scattering particles 31, and the phosphor layer containing the quantum dot phosphors 20 and the further phosphor 40. The region containing the scattering particles 31 can be cast more easily since only the scattering particles 31 contribute to the solids content. Thus, a higher concentration of the scattering particles 31 is also possible in this region. Additionally or alternatively, it is also possible for high-density particles 32 to be present in the region that contains the scattering particles 31 here and/or for scattering converting particles 33 to be present in the region containing the quantum dot phosphors 20 (not shown here).

Figure 8:
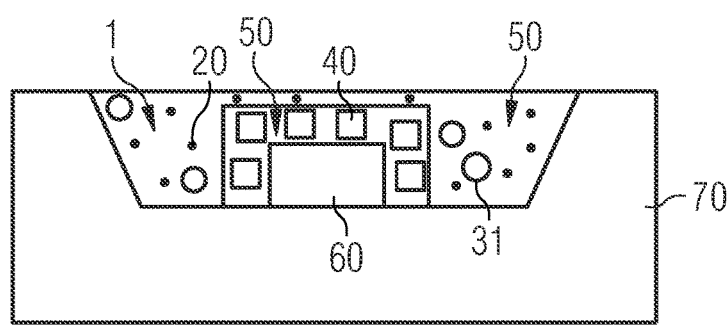

FIG. 8 shows, in a schematic section view, a further embodiment of the optoelectronic component. Here, a region of the phosphor mixture 1 containing phosphors 40, for example green phosphors, embedded in a matrix 50 is in an adjoining arrangement with the semiconductor chip 60. Positioned further removed from the semiconductor chip 60 is the region of the phosphor mixture 1 containing the quantum dot phosphors 20 and optionally further functional materials, here by way of example scattering particles 31. In this example, there is thus a spatial separation of phosphors 40 and quantum dot phosphors 20. The blue radiation emitted by the semiconductor chip 60 must thus first pass through the phosphors 40 before it hits the quantum dot phosphors 20. Thus, the flow density of the blue light at the quantum dot phosphors 20 is lowered, which increases the efficiency of the quantum dot phosphors 20. It is also possible for scattering converting particles 33 to be disposed in the region containing the phosphors 40 (not shown here).

The invention is not limited to the working examples by the description with reference thereto. Instead, the invention includes every new feature and every combination of features, which especially includes any combination of features in the claims, even if this feature or this combination itself is not specified explicitly in the claims or working examples.

This patent application claims the priority of German patent application 10 2017 129 917.3, the disclosure content of which is hereby incorporated by reference.

LIST OF REFERENCE NUMERALS 1 phosphor mixture
20 quantum dot phosphor
31 scattering particles
32 high-density particles
33 scattering converting particles 40 phosphor
50 matrix
60 semiconductor chip
70 housing
80 frame
90 substrate

The invention claimed is:

1. A phosphor mixture, comprising:
   at least one quantum dot phosphor;
   at least one functional material; and
   at least on further phosphor;
   wherein the functional material comprises scattering particles configured to scatter electromagnetic radiation, the scattering particles having a diameter selected from a range of 0.5 µm to 5 µm, wherein the scattering particles include garnets, and/or wherein the functional material comprises second particles having a density of not less than 2 g/cm$^3$, and having a second diameter of not less than 5 µm, wherein the second particles include garnets; and
   wherein the at least one quantum dot phosphor and the functional material are in a form of a mixture of particles embedded in a matrix; and
   wherein the further phosphor comprises a material selected from the group consisting of $N(N_aM_{1-a})SX_2AX_2NX_6$:D where N is at least one divalent metallic element, M is a divalent metallic element other than N, D comprises one, two or more elements from the group of Mn, Ce, Pr, Nd, Sm, Eu, Tb, Dy, Ho, Er, Tm, alkali metals and Yb, SX comprises at least one tetravalent element, AX comprises at least one trivalent element, NX comprises at least one element selected from the group of N, O, F, Cl, the parameter a is between 0.6 and 1.0 inclusive,
   $Sr_xCa_{1-x}AlSiN_3$:Eu where between 0.1% and 5% inclusive of the Sr—Ca lattice sites and/or of the Sr lattice sites and/or of the Ca lattice sites are replaced by Eu,
   $(M)_{2-2x}Eu_{2x}Si_5N_8$ with M=Sr, Ca and/or Ba and $0.001 \leq x \leq 0.2$,
   beta-SiAlON $Si_{6-x}Al_zO_yN_{8-y}$:RE where $0<x\leq4$, $0<y\leq4$, $0<z<1$ and RE contains one or more elements selected from rare earth metals,
   $Y_3(Al_{1-x}Ga_x)_5O_{12}$:Ce where the proportion of Ga is $0.2<x\leq0.6$,
   $(Gd,Y)_3(Al_{1-x}Ga_x)_5O_{12}$:Ce having a cerium content of 1.5-5 mol and a gallium content x between 0 to 0.5,
   $(Tb,Y)_3(Al_{1-x}Ga_x)_5O_{12}$:Ce having a cerium content of 1.5-5 mol and a gallium content x between 0 to 0.5,
   $Lu_3(Al_{1-x}Ga_x)_5O_{12}$:Ce having a cerium content of 0.5-5 mol % and a gallium content x between 0 to 0.5,
   $(Lu,Y)_3(Al_{1-x}Ga_x)_5O_{12}$:Ce having a cerium content of 0.5-5 mol % and a gallium content x between 0 to 0.5, and mixtures thereof.

2. The phosphor mixture as claimed in claim 1, wherein the scattering particles have a proportion in the phosphor mixture selected from a range of 1% to 5% by weight.

3. The phosphor mixture as claimed in claim 1, wherein the second particles have a proportion in the phosphor mixture of not more than 50% by weight.

4. The phosphor mixture as claimed in claim 1, wherein the scattering particles are configured to convert electromagnetic radiation of a first wavelength range at least partly to electromagnetic radiation of a second wavelength range.

5. The phosphor mixture as claimed in claim 4, wherein the electromagnetic radiation of the second wavelength range are selected from a red spectral region and/or from a green spectral region.

6. The phosphor mixture as claimed in claim 1, wherein the at least one quantum dot phosphor is selected from a group consisting of CdSe, CdS, CdTe, InP, InAs, Cl(Z)S, AlS, $Zn_3N_2$, Si, ZnSe, ZnO and GaN.

7. The phosphor mixture as claimed in claim 1, wherein the at least one further phosphor is present in the phosphor mixture with a proportion of 20% to 30% by weight.

8. The phosphor mixture as claimed in claim 1, wherein the at least one quantum dot phosphor and the functional material arranged as particles in the matrix in two different, adjoining regions.

9. The phosphor mixture as claimed in claim 8, wherein a region of the adjoining regions comprising the quantum dot phosphor is free of further phosphors.

10. A conversion element including the phosphor mixture as claimed in claim 1.

11. An optoelectronic component, comprising:
    at least one radiation-emitting semiconductor chip that emits electromagnetic radiation of a first wavelength range, and
    the phosphor mixture as claimed in claim 1.

12. The optoelectronic component as claimed in claim 11, wherein the phosphor mixture is present in a conversion element disposed on the semiconductor chip.

13. The optoelectronic component as claimed in claim 11, wherein the phosphor mixture is in an encapsulating arrangement on the semiconductor chip.

14. An optoelectronic component, comprising:
    at least one radiation-emitting semiconductor chip that emits electromagnetic radiation of a first wavelength range, and
    a phosphor mixture comprising at least one quantum dot phosphor, at least one functional material and
    at least one further phosphor different from the quantum dot phosphor;
    wherein the functional material comprises scattering particles configured to scatter electromagnetic radiation, the scattering particles having a diameter selected from a range of 0.5 µm to 5 µm, wherein the scattering particles include garnets, and/or wherein the functional material comprises second particles having a density of not less than 2 g/cm3, and having a second diameter of not less than 5 µm, wherein the second particles include garnets;
    wherein the at least one quantum dot phosphor and the functional material are in a form of a mixture of particles embedded in a matrix;
    wherein the quantum dot phosphor and the further phosphor are arranged in a first layer;
    wherein the functional material is arranged in a second layer such that the quantum dot phosphor and the functional material are spatially separated; and
    wherein the second layer forms a radiation exit surface of the optoelectronic component.

15. An optoelectronic component, comprising:
    at least one radiation-emitting semiconductor chip that emits electromagnetic radiation of a first wavelength range, and
    a phosphor mixture comprising at least one quantum dot phosphor, at least one functional material and
    at least one further phosphor different from the quantum dot phosphor;

wherein the functional material comprises scattering particles configured to scatter electromagnetic radiation, the scattering particles having a diameter selected from a range of 0.5 μm to 5 μm, wherein the scattering particles include garnets, and/or wherein the functional material comprises second particles having a density of not less than 2 g/cm3, and having a second diameter of not less than 5 μm, wherein the second particles include garnets;

wherein the at least one quantum dot phosphor and the functional material are in a form of a mixture of particles embedded in a matrix;

wherein the further phosphor is arranged in a first layer;

wherein the quantum dot phosphor and the functional material are arranged in a second layer;

wherein the first layer and the second layer are spatially separated;

wherein the second layer forms a radiation exit surface of the optoelectronic component; and wherein the first layer is arranged between the radiation-emitting semiconductor chip and the second layer.

\* \* \* \* \*